(12) United States Patent
Pirk et al.

(10) Patent No.: US 8,384,975 B2
(45) Date of Patent: Feb. 26, 2013

(54) MICROMECHANICAL ASSEMBLY HAVING A DISPLACEABLE COMPONENT

(75) Inventors: Tjalf Pirk, Stuttgart (DE); Stefan Pinter, Reutlingen (DE); Joachim Fritz, Tuebingen (DE); Christoph Friese, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 233 days.

(21) Appl. No.: 12/893,778

(22) Filed: Sep. 29, 2010

(65) Prior Publication Data

US 2011/0090551 A1    Apr. 21, 2011

(30) Foreign Application Priority Data

Oct. 15, 2009   (DE) .......................... 10 2009 045 720

(51) Int. Cl.
*G02B 26/08* (2006.01)
(52) U.S. Cl. .................................................. 359/221.2
(58) Field of Classification Search .... 359/223.1–226.1, 359/290, 291, 221.1, 871
See application file for complete search history.

(56) References Cited

U.S. PATENT DOCUMENTS

2009/0002798 A1*   1/2009   Ohmori ........................ 359/226

OTHER PUBLICATIONS

"Vertically Operating Electrostatic Comb-Drive" (D. Nuesse, M. Hoffmann, and E. Voges, Actuator 2004, 9th International Conference on New Actuators, Jun. 14-16, 2004, Bremen, Proceedings (2004), pp. 502-505).

* cited by examiner

*Primary Examiner* — Euncha Cherry
(74) *Attorney, Agent, or Firm* — Kenyon & Kenyon LLP

(57) ABSTRACT

A micromechanical assembly having a mounting, at least one stator electrode comb, which is fixedly placed on the mounting, having at least two stator electrode fingers, whose central longitudinal axes are on a central plane of the stator electrode comb, at least one actuator electrode comb having at least two actuator electrode fingers, and a displaceable component, which is coupled to the at least one actuator electrode comb so that the displaceable component is displaceable in relation to the mounting at least in one first displacement direction using a nonzero operating voltage, which is applied between the at least two stator electrode fingers and the at least two actuator electrode fingers, the first displacement direction having one first nonzero directional component perpendicular to the central plane.

13 Claims, 9 Drawing Sheets

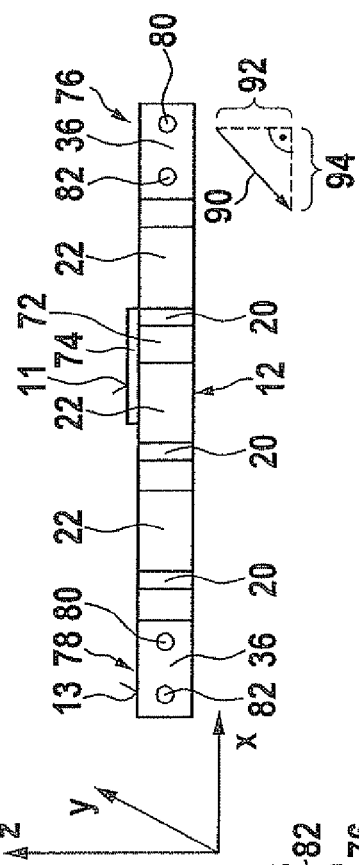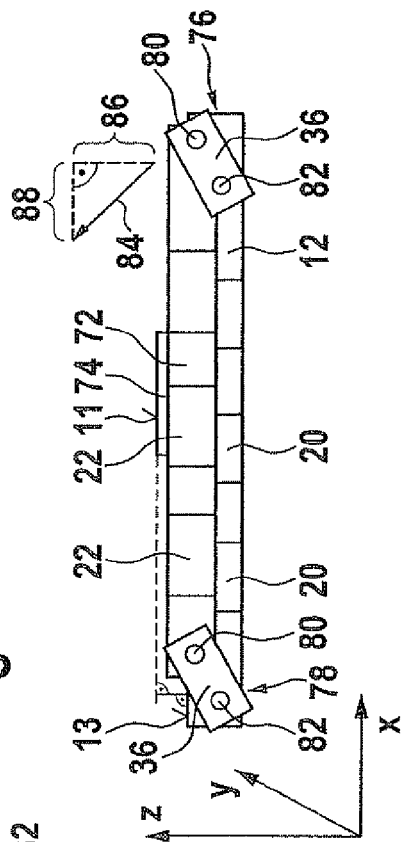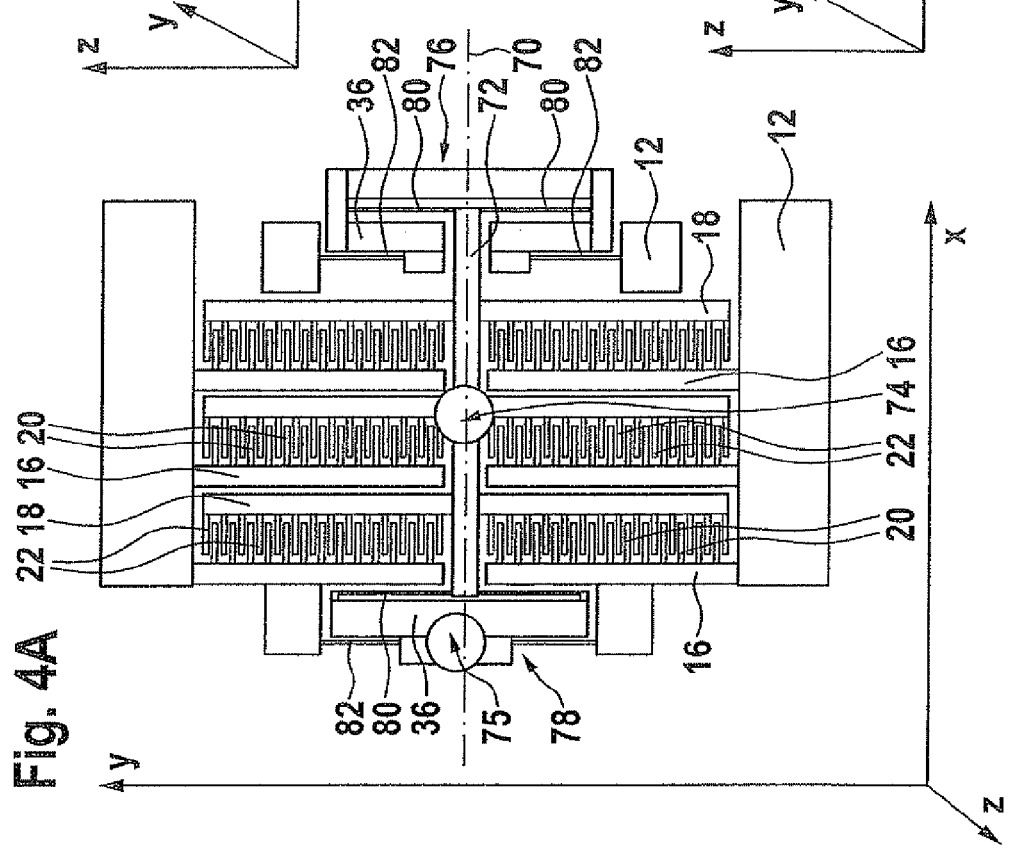

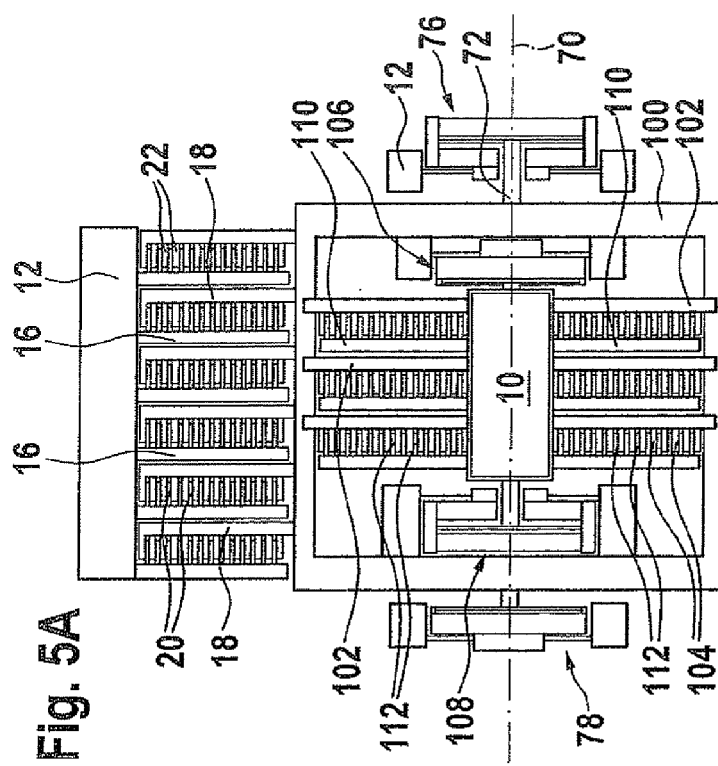
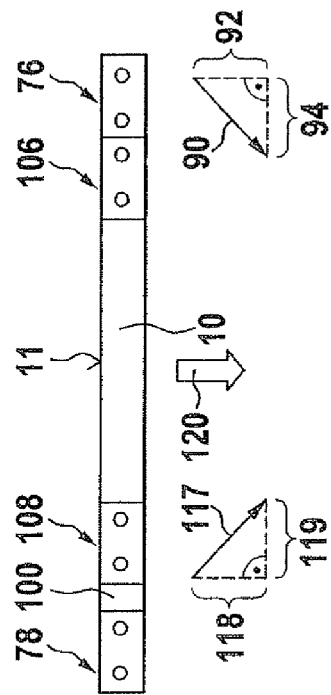
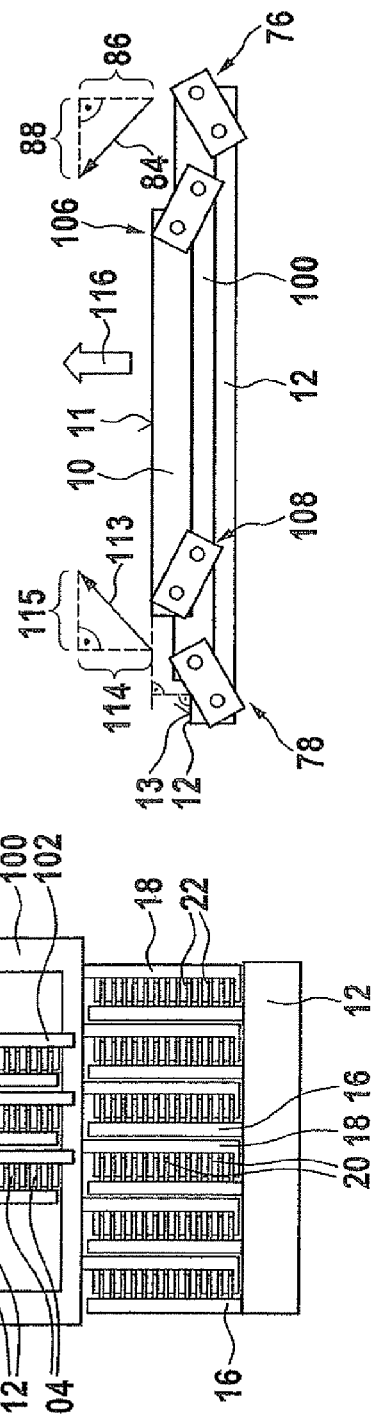
Fig. 5A
Fig. 5B
Fig. 5C

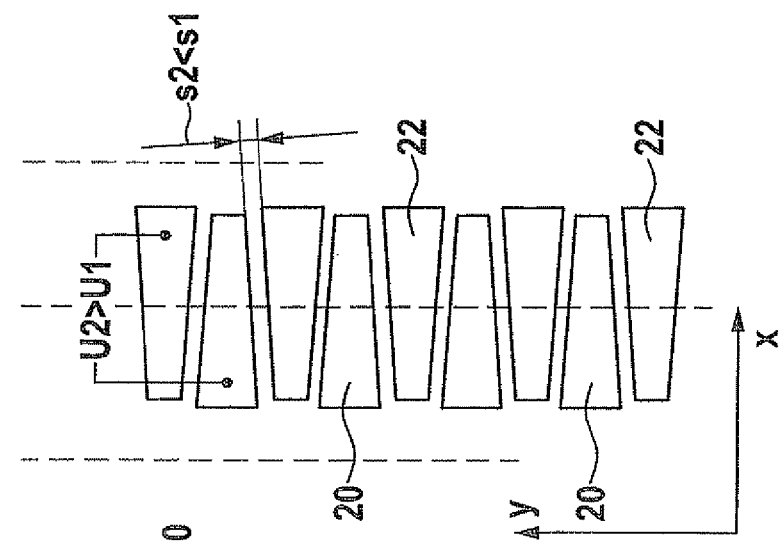
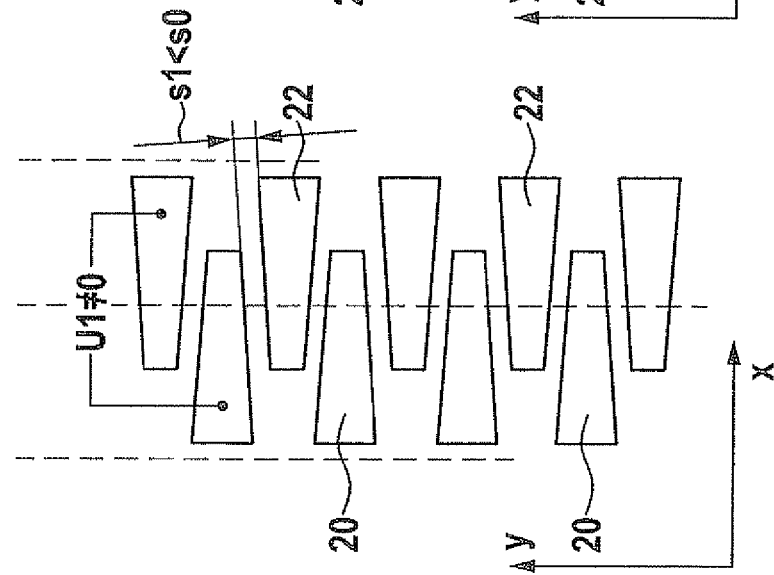
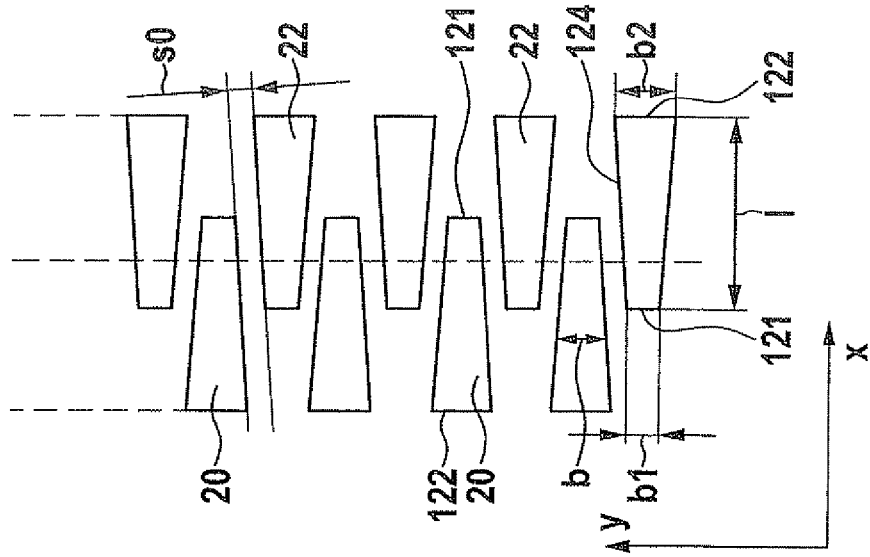

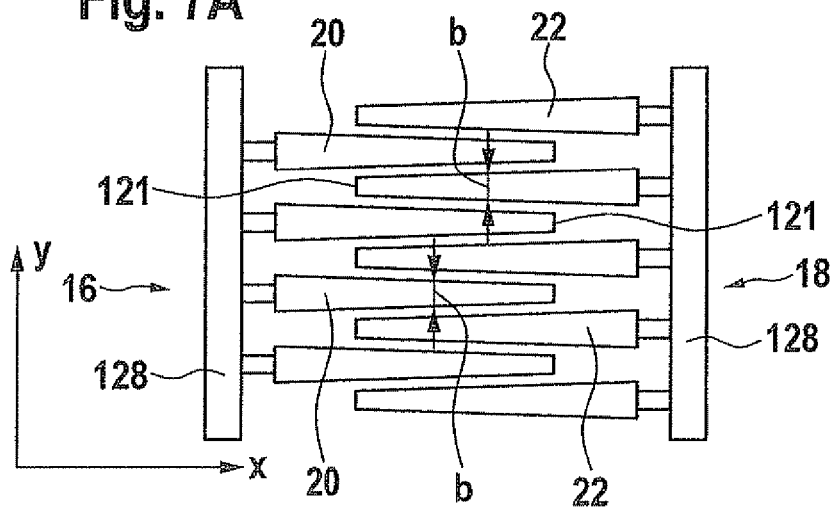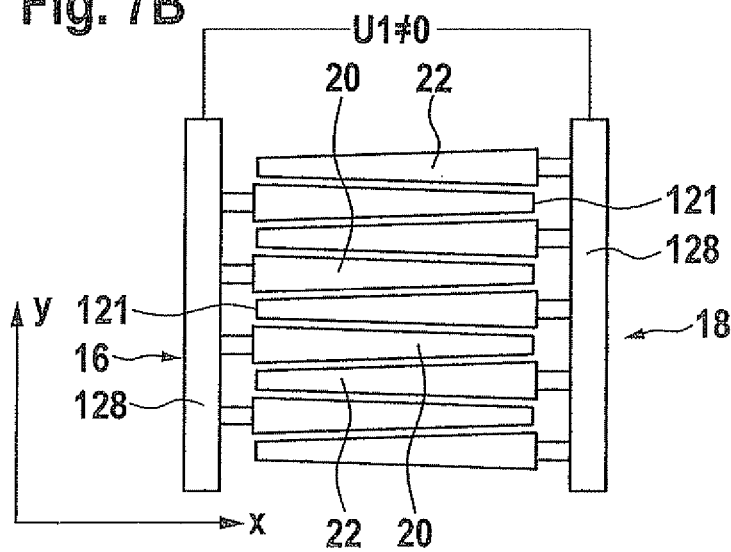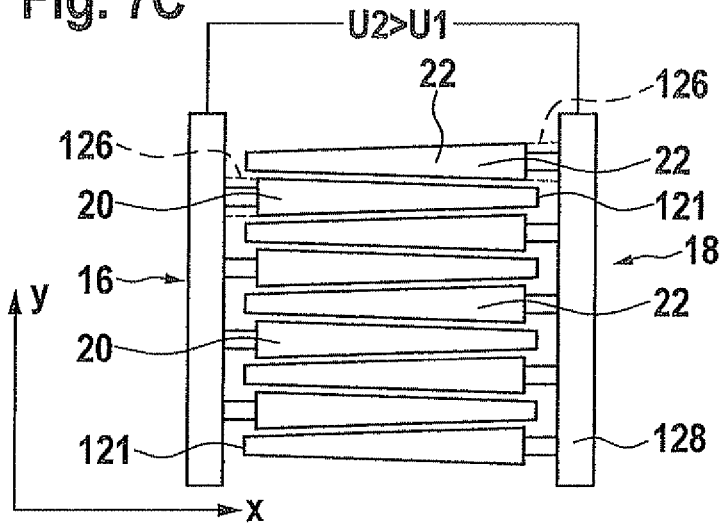

US 8,384,975 B2

MICROMECHANICAL ASSEMBLY HAVING A DISPLACEABLE COMPONENT

RELATED APPLICATION INFORMATION

The present application claims priority to and the benefit of German patent application no. 10 2009 045 720.8, which was filed in Germany on Oct. 15, 2009, the disclosure of which is incorporated herein by reference.

FIELD OF THE INVENTION

The present invention relates to a micromechanical assembly having a displaceable component.

BACKGROUND INFORMATION

A micromechanical assembly having fixed electrode fingers and movable electrode fingers is described in the publication "Vertically Operating Electrostatic Comb-Drive" (D. Nüsse, M. Hoffmann, and E. Voges, Actuator 2004, 9th International Conference on New Actuators, 14-16 Jun. 2004, Bremen, Proceedings (2004), pages 502-505). The displaceable electrode fingers are perpendicular to a displaceable surface. The displaceable surface may be moved in a direction parallel to the central longitudinal axes of the fixed electrode fingers via the application of a voltage between the electrode fingers.

SUMMARY OF THE INVENTION

The exemplary embodiments and/or exemplary methods of the present invention provides a micromechanical assembly having the features described herein.

In the case of the micromechanical assembly it is possible to displace the displaceable component in relation to the mounting in one first displacement direction having one first directional component which is perpendicular to the central plane of the stator electrode comb. The exemplary embodiments and/or exemplary methods of the present invention thus allows a micromechanical assembly having a displaceable component, which is displaceable perpendicularly out of the plane of the electrode combs. The micromechanical assembly is therefore suitable for possible applications in which a perpendicular displacement movement out of the plane of the electrode combs instead of a rotational movement and/or a movement of the displaceable component in the plane of the electrode combs. The micromechanical assembly may thus be used advantageously for many possible applications.

The displaceable component may be connected to the mounting together with the at least one actuator electrode comb via at least one spring, for example. In particular, the displaceable component and the at least one spring may be structured out of a material layer. An alignment of the displaceable component on the mounting is not necessary in this case.

In particular, a refinement of the micromechanical assembly offers an expansion of the SEA principle (switching electrode actuator) to a component which is displaceable perpendicularly to its maximum extension. Above all, in this way the displaceable component is displaceable perpendicularly to its maximum extension in two opposing displacement directions. The exemplary embodiments and/or exemplary methods of the present invention thus offers bidirectional displaceability of the displaceable component. The displaceable component may be displaceable by 50 µm in both transla-tional movement directions, for example. A large deflection of the displaceable component out of the plane of the micromechanical assembly may thus be implemented.

The micromechanical assembly offers the advantages of static actuation, in particular comparatively low power consumption. No further drive components, such as magnets, have to be placed on the micromechanical assembly in addition to the comb electrodes. The micromechanical assembly thus only has drive components having a comparatively small required installation space.

An alignment of the drive components to one another is not required during the manufacturing of the micromechanical assembly. Instead, the alignment-critical parts of the micromechanical assembly may be etched out of two conductive layers, between which an insulating layer is implemented, using a single mask in a micromechanical process. The micromechanical assembly is thus manufacturable in a cost-effective and simple manner.

The micromechanical assembly may be used, for example, in microoptics, in particular in interferometry. An actuator which is equipped with the micromechanical assembly may also be used for actuating positioning mirrors in spectrometers. It is also possible to displace small lenses/beam splitters in microoptics using the micromechanical assembly. The micromechanical assembly is also usable in a control element for a mechanical switch or a valve, however.

Further features and advantages of the present invention are explained hereafter on the basis of the figures.

BRIEF DESCRIPTION OF THE DRAWINGS

FIGS. 4A through 4C show one schematic top view and two schematic cross sections to illustrate a fourth specific embodiment of the micromechanical assembly.

FIGS. 5A through 5C show one schematic top view and two schematic cross sections to illustrate a fifth specific embodiment of the micromechanical assembly.

FIGS. 6A through 6C show three schematic top views of electrode fingers to illustrate a sixth specific embodiment of the micromechanical assembly.

FIGS. 7A through 7C show three schematic top views of electrode combs to illustrate a seventh specific embodiment of the micromechanical assembly.

DETAILED DESCRIPTION

FIGS. 1A through 1D show two schematic top views and two schematic cross sections to illustrate a first specific embodiment of the micromechanical assembly.

Figure 1A:
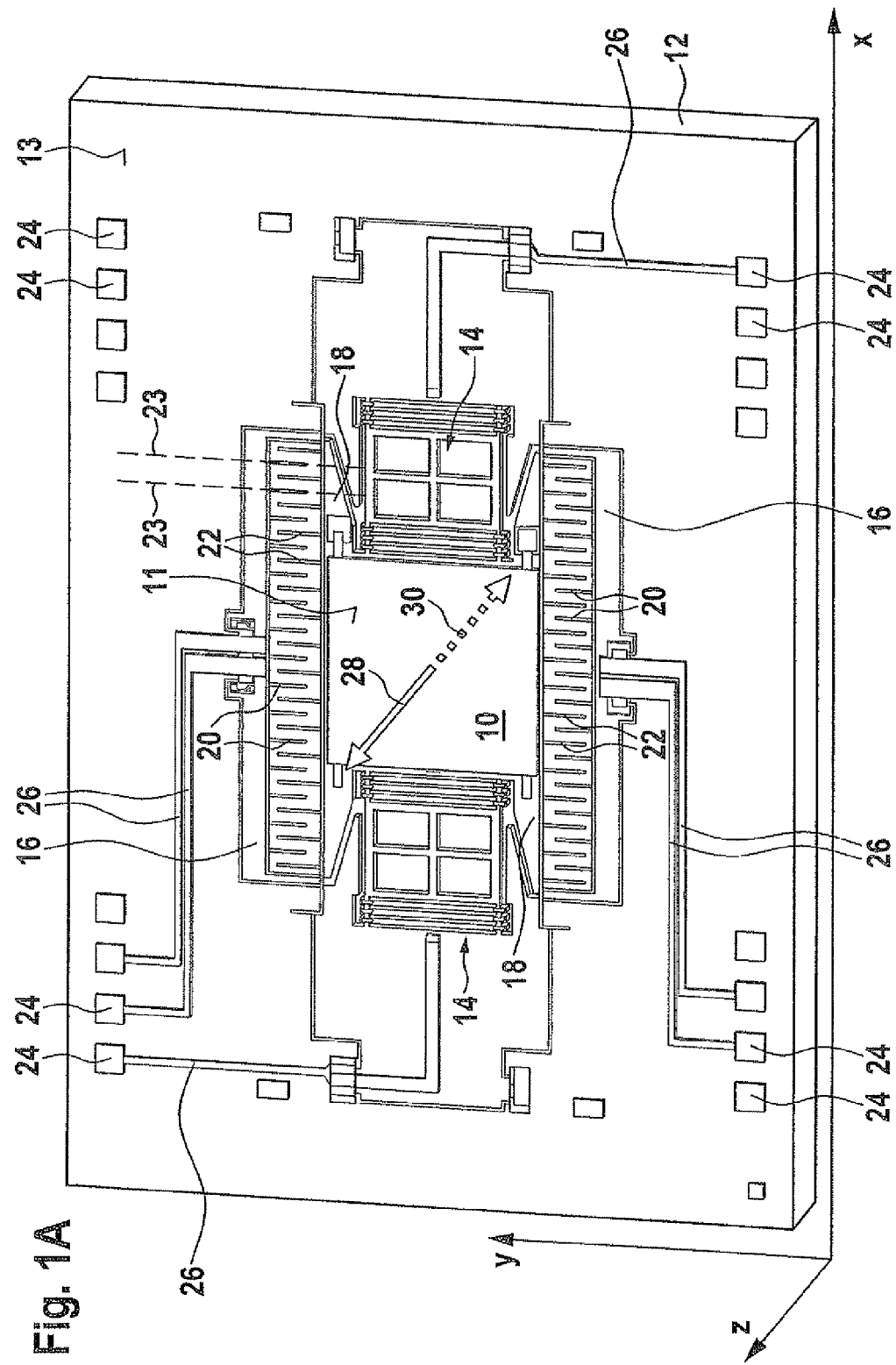
FIGS. 1A through 1D show two schematic top views and two schematic cross sections to illustrate a first specific embodiment of the micromechanical assembly.

The micromechanical assembly which is shown in a top view in FIG. 1A includes a displaceable component 10, which is displaceable in relation to a mounting 12 in the way described in greater detail hereafter. Mounting 12 may be a semiconductor substrate, for example. Mounting 12, to which displaceable component 10 is connected via at least one spring 14, may be designed as planar or frame-shaped. In particular, two spatial axes x and y, which are perpendicular to one another, may be definable, along which the mounting has a greater extension than along a z axis, which is perpendicular to the x axis and the y axis. It is assumed hereafter that a (maximum) top side 13 of mounting 12 is parallel to the xy plane. However, the micromechanical assembly is not restricted to a specific shape of mounting 12.

Displaceable component 10 advantageously includes an optical element, such as a mirror surface, a lens, and/or a beam splitter. For example, by coating using a metal, displaceable component 10 may be implemented as a displaceable mirror which is suitable for interferometric applications. However, it is to be noted that the micromechanical assembly is not restricted to a displaceable component 10 implemented as an optical element.

Displaceable component 10 may also be designed in such a way that it has a greater dimension along the x axis and/or the y axis than along the z axis. Displaceable component 10 may be designed in particular as a planar actuatable plate. Such a shape is very advantageous for using displaceable component 10 as an optical element. A (maximum) top side 11 of displaceable component 10 may be parallel to top side 13 of mounting 12 and/or the xy plane. However, a planar design of the displaceable component is not required for the embodiment of the micromechanical assembly.

The micromechanical assembly has at least one stator electrode comb 16, which is placed on mounting 12. Placing the at least one stator electrode comb 16 on mounting 12 may be understood to mean that the stator electrode comb is connected directly or indirectly to mounting 12 in such a way that stator electrode comb 16 is only displaceable in relation to mounting 12 using a comparatively high force. The position of the stator electrode comb in relation to mounting 12 is thus not impaired by a displacement movement of displaceable component 10.

The at least one stator electrode comb has at least two stator electrode fingers 20, whose central longitudinal axes 23 define a central plane of stator electrode comb 16, i.e., central longitudinal axes 23 lie on the central plane of stator electrode comb 16. In the specific embodiment shown, the central plane (not shown) runs parallel to the xy plane and to top sides 11 and 13.

An actuator electrode comb 18 is located adjacent to the at least one stator electrode comb 16 in each case. The at least one actuator element 18 also has at least two actuator electrode fingers 22. Actuator electrode fingers 22 may also be parallel to the central plane, to the xy plane, to top side 11 of displaceable component 10, and/or to top side 13, i.e., their central longitudinal axes (not shown) may extend parallel thereto.

Contacts 24 may be implemented on the micromechanical assembly, and electrode combs 16 and 18 are electrically connected via lines 26 to associated contacts 24 in such a way that a nonzero voltage is applicable via contacts 24 and lines 26 between a stator electrode comb 16 and associated actuator electrode comb 18. Displaceable component 10 is coupled to the at least one actuator electrode comb 18 in such a way that displaceable component 10 is also movable via a displacement movement of the at least one actuator electrode comb 18. In particular, electrode combs 16 and 18 may be oriented to one another in such a way that in particular if a voltage is applied between electrode combs 16 and 18, stator electrode fingers 20 of a stator electrode comb 16 protrude into gaps, which are spanned by actuator electrode fingers 22 of associated actuator electrode comb 18. The precise procedure for applying a voltage between electrode combs 16 and 18 for a displacement movement of displaceable component 10 is described in greater detail hereafter.

Electrode combs 16 and 18 and/or the at least one spring 14 are designed in such a way that displaceable component 10 is displaceable in at least one first displacement direction 28 using a nonzero first voltage applied between electrode combs 16 and 18, first displacement direction 28 having at least one nonzero first directional component, which is perpendicular to the central plane. The first directional component may thus also be perpendicular to the xy plane, to top side 11 of displaceable component 10, and/or to top side 13. First displacement direction 28, as shown, may be perpendicular to the central plane. First displacement direction 28 may also be perpendicular to the xy plane, to top side 11 of displaceable component 10, and/or to top side 13.

In addition, displaceable component 10 may be displaceable in at least one second displacement direction 30 using one second nonzero voltage, which is applied between electrode combs 16 and 18. Second displacement direction 30 may have one second nonzero directional component, which is perpendicular to the central plane, and/or is opposite to first displacement direction 28.

In the illustrated specific embodiment, displaceable component 10 is connected to mounting 12 via two springs 14 in such a way that first displacement direction 28 and opposing second displacement direction 30 are parallel to the z axis. First spring 14 is implemented as mirror-symmetric to second spring 14. First spring 14 may be implemented as mirror-symmetric to second spring 14 with respect to a central axis of displaceable component 10, which is parallel to the y axis. The first spring may also be implemented as mirror-symmetric to the second spring with respect to an axis of symmetry through the displaceable component.

Figure 1B:
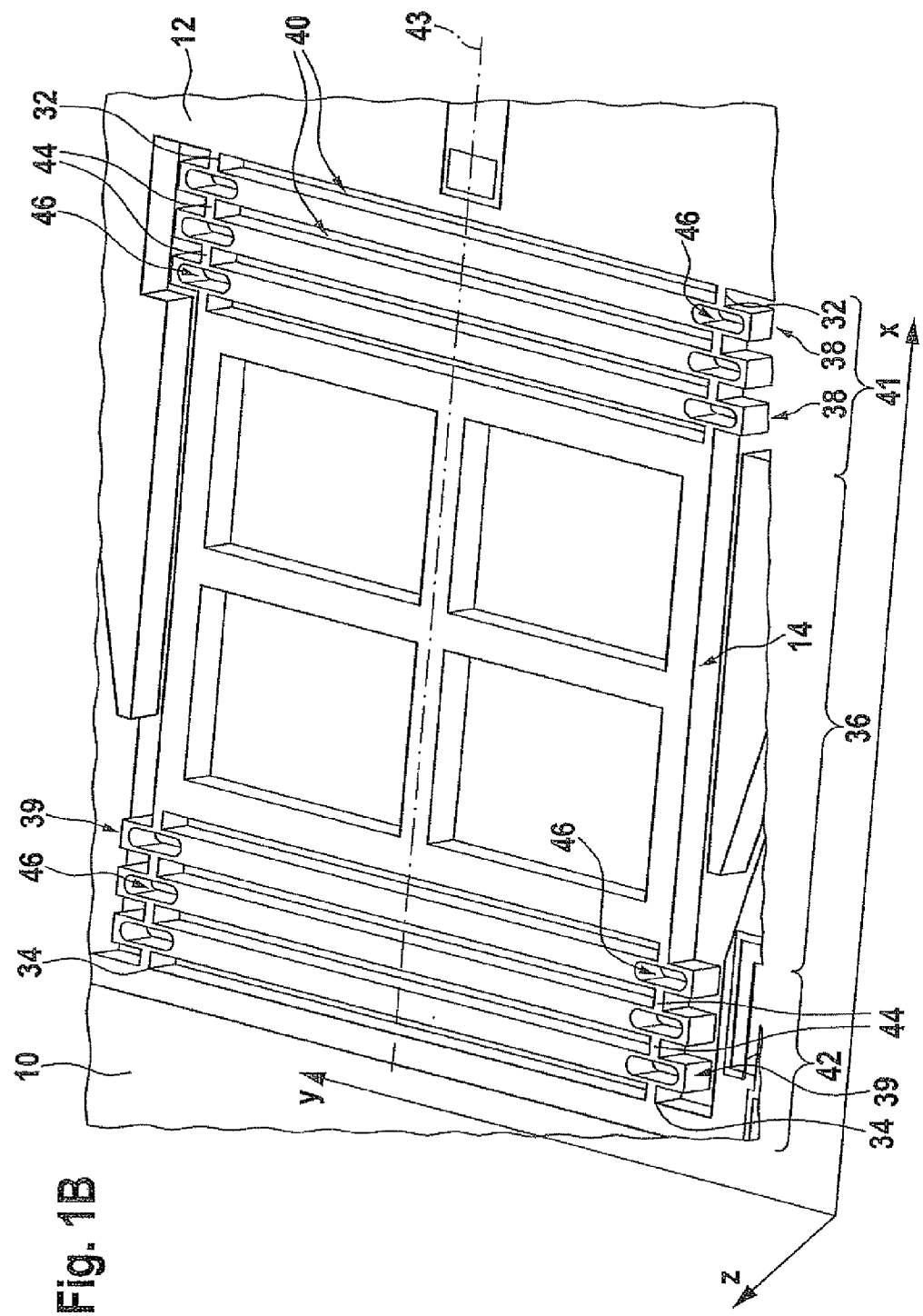

FIG. 1B shows an enlarged detail of FIG. 1A having first spring 14. The shape of springs 14 shown in FIGS. 1A and 1B ensures that a displacement movement of displaceable component 10 along the x axis and the y axis is preventable. The micromechanical assembly is thus suitable in particular for reliable adherence to a displacement movement of displaceable component 10 along the z axis, i.e., perpendicularly to top side 11 of displaceable component 10 and/or to top side 13 of mounting 12. This may also be described in such a way that the micromechanical assembly is designed as a z actuator, in which centrally placed displaceable component 10, which may be plate-shaped, is actuatable from the chip plane of mounting 12, which is implemented as an actuator chip.

However, it is to be noted that the micromechanical assembly is also expandable in such a way that displaceable component 10 is additionally displaceable along the x axis and/or the y axis. In particular, the micromechanical assembly may be designed in such a way that displaceable component 10 is displaceable along the x axis and/or the y axis using at least one drive, which is activatable separately from electrode combs 16 and 18.

As shown in FIG. 1B, at least one outer end section 32 of first spring 14 contacts mounting 12. The at least one outer end section 32 may be anchored on mounting 12, for example. At least one inner end section 34, which contacts displaceable component 10, is implemented on a side of first spring 14 facing away from the at least one outer end section 32. The at least one inner end section 34 may also be anchored on displaceable component 10. First spring 14 may be implemented in one piece with at least parts of mounting 12 and/or displaceable component 10. For example, springs 14 may be structured out of a semiconductor layer together with at least parts of mounting 12 and/or displaceable component 10.

A lever 36 is implemented in an area of spring 14 between the at least one first end section 32 and the at least one second end section 34. Lever 36 may have a planar design. Lever 36 may be formed in such a way that bending of lever 36, in particular arching of the maximum surface of lever 36, requires a comparatively high force. It is thus ensured that a voltage applied between electrode combs 16 and 18 causes little or no bending of lever 36. In order to reduce the mass of lever 36, it may be designed as a framework. In particular in the case of a lattice structure of lever 36, it is ensured that lever 36 has a high bending stiffness in spite of a comparatively low mass.

Lever 36 is connected to the at least one outer end section 32 via at least one outer torsion joint 38 and to the at least one inner end section 34 via at least one inner torsion joint 39. In illustrated first spring 14, lever 36 is connected to mounting 12 via three outer torsion joints 38 and to displaceable component 10 via three inner torsion joints 39. However, the micromechanical assembly is not restricted to a specific number of torsion joints 38 or 39.

The force to be applied to displace displaceable component 10 along the z axis is reduced by the formation of more than two torsion joints 38 and/or 39. In particular, it may thus be ensured that displaceable component 10 remains parallel to the mounting, while lever 36 is displaced into an inclined position in relation to mounting 12.

To form the at least one torsion joint 38 and 39, through openings 40 are formed in such a way in an outer torsion area 41 of spring 14 between lever 36 and the at least one outer end section 32 and in an inner torsion area 42 of a spring 14 between lever 36 and the at least one inner end section 34 that torsion joints 38 and 39 are formed/structured out of torsion areas 41 and 42 as webs running perpendicularly to a central longitudinal axis 43 of the spring. If torsion area 41 or 42 has more than one torsion joint 38 or 39, two adjacent torsion joints 38 or 39 are connected via at least one narrow connection area 44, which is perpendicular to central longitudinal axis 43. Lever 36 is also connected to adjacent torsion joint 38 of outer torsion area 41 and adjacent torsion joint 39 of inner torsion area 42 via at least one narrow connection area 44, which is perpendicular to central longitudinal axis 43, in each case. Torsion areas 41 and 42 thus have a significantly lower bending stiffness than lever 36, in particular in the case of arching of the maximum surfaces of torsion areas 41 and 42. This may also be expressed in such a way that a bending stiffness of lever (36) is greater than a bending stiffness of outer torsion area (41) and/or a bending stiffness of inner torsion area (42).

Two outer end sections 32 and two inner end sections 34 may be formed on each of the two springs 14. Two connection areas 44 may also be formed in each case between two adjacent torsion joints 38 or 39, between lever 36 and adjacent torsion joint 38 of outer torsion area 41, and between lever 36 and adjacent torsion joint 39 of inner torsion area 42. The doubled design of end sections 32 and/or 34 and/or connection areas 44 reduces the sensitivity of springs 14 to lateral forces. The broad layout of lever 36 also contributes positively to reducing the sensitivity of springs 14 to lateral forces.

First spring 14 may be designed in such a way that it may vary its length along the z axis during a displacement movement of displaceable component 10. This may be implemented in that a through opening 46 is formed in the areas of torsion joints 38 or 39 between an end section 32 or 34 and a connection area 44 or between two connection areas 44. Such an opening 46 may also be referred to as an O-spring area of a torsion joint 38.

Figure 1C:
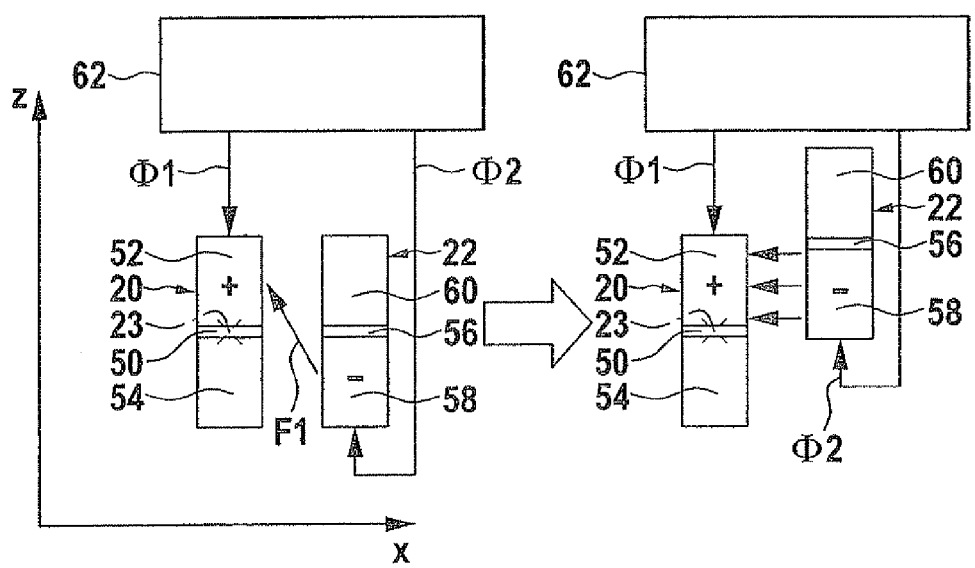
Figure 1D:
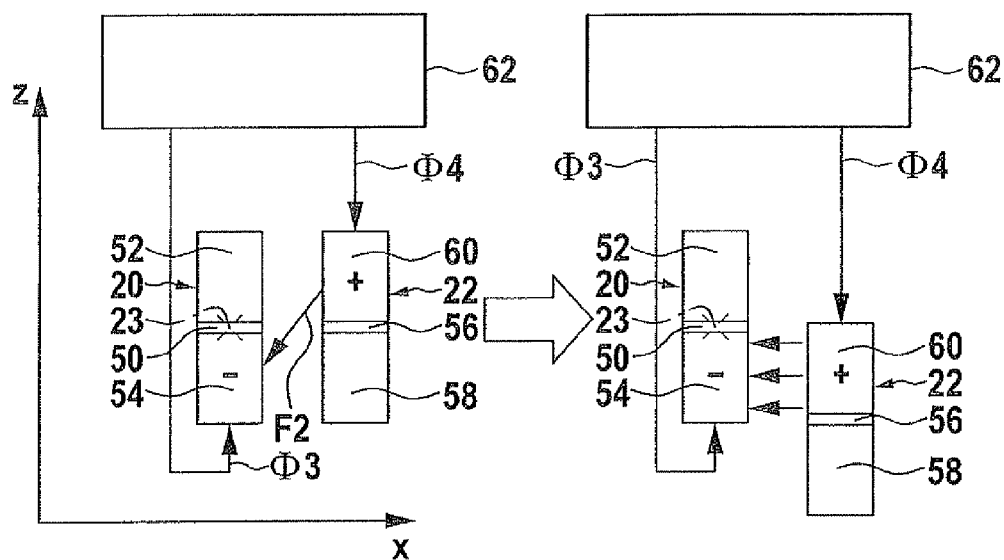

A schematic cross section through a stator electrode finger 20 and an adjacent actuator electrode finger 22 is shown in FIGS. 1C and 1D to illustrate the structure of electrode fingers 20 and 22, or of electrode combs 16 and 18.

Illustrated stator electrode finger 20 is divided by a stator insulating layer 50 into one first conductive stator area 52 and one second conductive stator area 54. Stator insulating layer 50 may be parallel to the central plane of stator electrode comb 16 and central longitudinal axis 23. The first conductive stator area is placed in first displacement direction 28 from stator insulating layer 50. In contrast, second conductive stator area 54 is in second displacement direction 30 from stator insulating layer 50.

Actuator electrode finger 22 is also divided by an actuator insulating layer 56 into one first conductive actuator area 58 and one second conductive actuator area 60. First conductive actuator area 58 may be in second displacement direction 30 from actuator insulating layer 56. Correspondingly, second conductive actuator area 60 may be implemented in first displacement direction 28 from actuator insulating layer 56. The actuator insulating layer may be parallel to stator insulating layer 50. Installation layers 50 and 56 may be in a common plane, if a nonzero voltage is not applied between conductive areas 52, 54, 58, and/or 60. This makes it easier to manufacture electrode combs 16 and 18 using structuring of components 50 to 60 out of a layered structure having two conductive layers and an insulating layer placed between them.

It is to be noted that the micromechanical assembly is not restricted to a formation of an electrode finger 20 or 22 having only one insulating layer 50 or 56. Instead, at least one of electrode fingers 20 or 22 may have at least one further insulating layer, which divides electrode finger 20 or 22 at least into one further conductive area.

The micromechanical assembly is coupled to an activation unit 62 in such a way that various potentials $\Phi 1$ through $\Phi 4$ are applicable to conductive areas 52, 54, 58, and 60 via contacts 24 and lines 26. Contacting of electrode fingers 20 and 22 allows desired electrical potentials $\Phi 1$ through $\Phi 4$, which are independent of one another, to be applied to various conductive areas 52, 54, 58, and 60. In particular, activation unit 62 and the contacting of conductive areas 52, 54, 58, and 60 to activation unit 62 may be designed in such a way that an application of a potential $\Phi 1$ through $\Phi 4$ to a conductive area 52, 54, 58, or 60 does not influence potential $\Phi 1$ through $\Phi 4$ which is applied to adjacent conductive area 52, 54, 58, or 60 of the same electrode finger 20 or 22.

In one first operating mode of activation unit 62, one first voltage made up of the difference of potentials $\Phi 1$ and $\Phi 2$ may be applied between first conductive stator area 52 and first conductive actuator area 58. The first nonzero voltage induces one first force F1, by which actuator electrode comb 18 is displaced together with displaceable component 10 in relation to stator electrode comb 16 and mounting 12 in first displacement direction 28 (in the positive z direction).

As schematically shown in FIG. 1D, activation unit 62 is designed in one second operating mode in such a way that one second voltage corresponding to the difference of potentials $\Phi 3$ and $\Phi 4$ may be applied between second conductive stator area 54 and second conductive actuator area 60. The second nonzero voltage induces a force F2, by which actuator electrode comb 18 and displaceable component 10 are displaced in relation to stator electrode comb 16 and mounting 12 in second displacement direction 30 (in the positive z direction).

The embodiment of electrode fingers 20 and 22, and of electrode combs 16 and 18, which is described in the above paragraphs, may also be referred to as an SEA drive (switching electrode actuator). The SEA drive allows a bidirectional displaceability of displaceable component 10 having at least one directional component perpendicular to the central plane of stator electrode comb 16.

In the illustrated design of electrode combs 20 and 22, a high energy density of the SEA drive is ensured. The capacity of the drive electrode system may be increased in a simple way by placing a sufficient number of electrode fingers 20 and 22 adjacent to one another. The pull-in problems may be mitigated at the same time.

The micromechanical assembly shown on the basis of FIGS. 1A through 1D may be cost-effectively manufactured using standard semiconductor technologies. In particular, the components of the micromechanical assembly may be structured in a simple way from two semiconductor and/or metal layers and an insulating layer placed between them.

The described micromechanical assembly may also be refined in such a way that the bidirectional displaceability of displaceable component 10 having at least one directional component perpendicular to the central plane of stator electrode comb 16 is additionally coupled to a rotational displaceability. As an alternative thereto, the micromechanical assembly may also be expanded in such a way that a displacement of displaceable component 10 is executable both perpendicularly to the central plane of stator electrode comb 16 and also in at least one directional component parallel to the central plane of stator electrode comb 16.

Figure 2A:
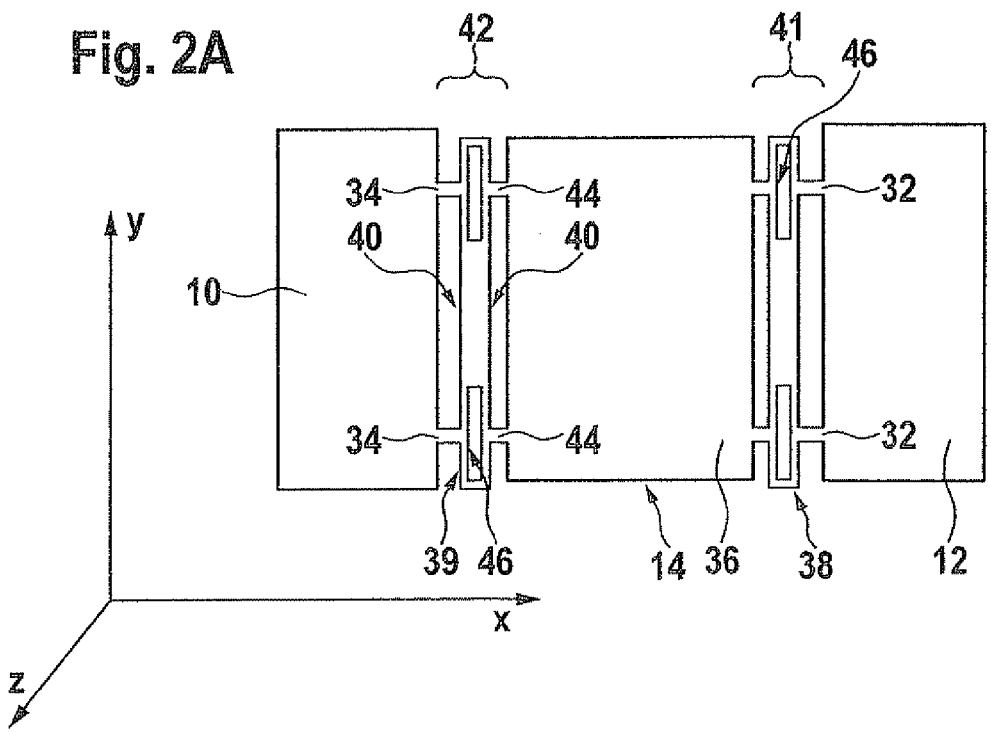
FIGS. 2A through 2C show one schematic top view and two schematic side views of a spring to illustrate a second specific embodiment of the micromechanical assembly.
Figure 2B:
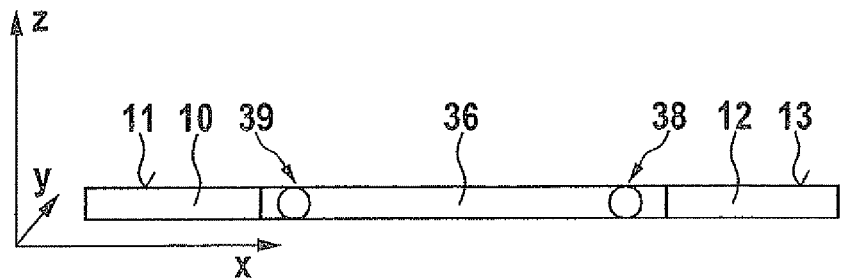
Figure 2C:
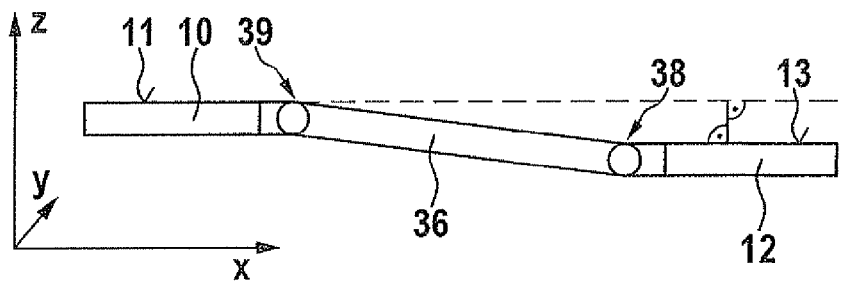

FIGS. 2A through 2C show one schematic top view and two schematic side views of a spring to illustrate a second specific embodiment of the micromechanical assembly.

The schematically shown micromechanical assembly may have above-described components 10, 12, 16, and 18. A further description of these components 10, 12, 16, and 18 will be dispensed with here. The two springs 14 of the micromechanical assembly, one of which is shown in FIGS. 2A through 2C, may be implemented as mirror-symmetric to one another. First spring 14 may be implemented as mirror-symmetric to second spring 14 with respect to a central axis of displaceable component 10, which is parallel to the y axis.

First spring 14 includes a lever 36, an outer torsion joint 38, which is placed between lever 36 and both outer end sections 32, and an inner torsion joint 39, which is placed between inner end sections 34 and lever 36.

FIG. 2B shows spring 14 in the deactivated mode of the activation unit, or in the deenergized state of electrode combs 16 and 18. If a nonzero voltage is not being applied between conductive areas 52, 54, 58, or 60 of electrode combs 16 and 18, spring 14 is parallel to the xy plane. In particular, lever 36 is parallel to top side 11 of displaceable component 10 and/or top side 13 of mounting 12 in the deenergized state of electrode combs 16 and 18.

As shown in FIG. 2C, a nonzero voltage applied between electrode combs 16 and 18 causes a displacement movement of displaceable component 10 parallel to the z direction. Lever 36 is displaced into an inclined position to the xy plane, to top side 11 of displaceable component 10, and/or to top side 13 of mounting 12.

Actuation perpendicular to the xy plane, to top side 11 of displaceable component 10, and/or to top side 13 of mounting 12 may thus be implemented instead of a torsion actuation even if a spring is equipped with only one outer torsion joint 38 and one inner torsion joint 39. In particular, displaceable component 10 is displaceable in such a way that a parallel orientation of top side 11 of displaceable component 10 to top side 13 of mounting 12 is maintained.

Figure 3A:
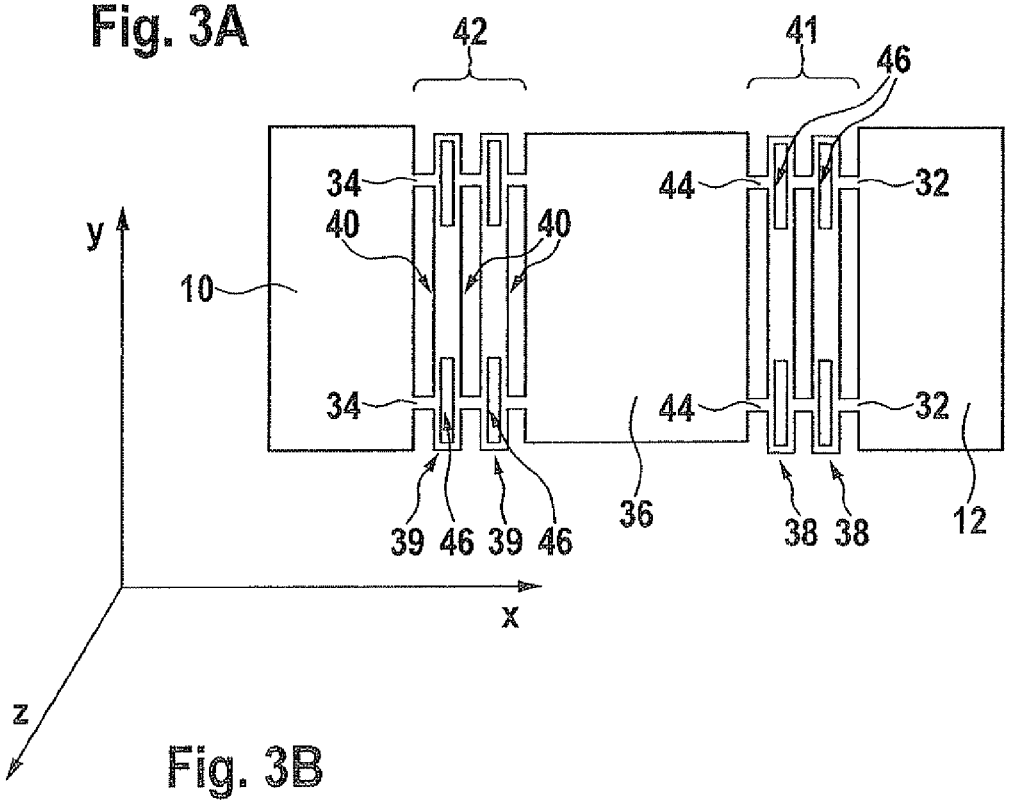
FIGS. 3A through 3C show one schematic top view and two schematic side views of a spring to illustrate a third specific embodiment of the micromechanical assembly.
Figure 3B:
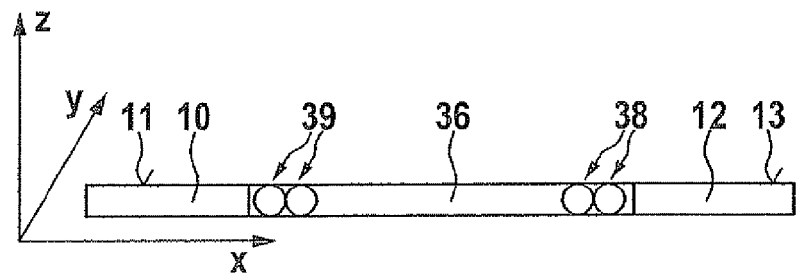
Figure 3C:
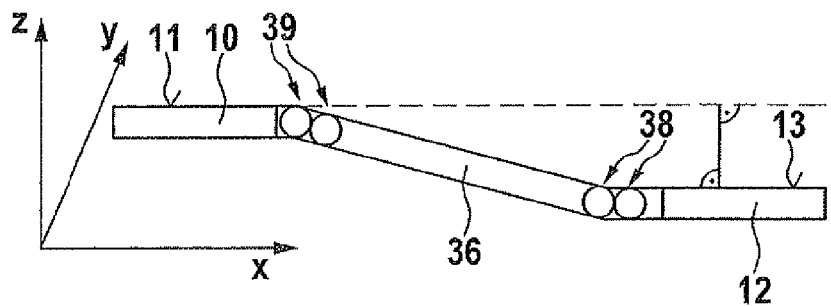

FIGS. 3A through 3C show one schematic top view and two schematic side views of a spring to illustrate a third specific embodiment of the micromechanical assembly.

Schematically shown (first) spring 14 has two outer torsion joints 38 and two inner torsion joints 39. Top side 11 of displaceable element 10 is also reliably prevented from being displaced into an inclined position with respect to the xy plane, or with respect to top side 13 of mounting 12, if a nonzero voltage is applied between electrode combs 16 and 18, in the case of the first spring having four torsion joints 38 and 39. It is thus possible in particular, by the attachment of such spring structures on two or more sides of displaceable element 10, to ensure a bidirectional displaceability of displaceable element 10 perpendicular to the xy plane, to top side 11 of displaceable element 10, and/or to top side 13 of mounting 12. In addition, the force to be applied to displace displaceable component 10 is reduced by equipping spring 14 with two outer torsion joints 38 and two inner torsion joints 39. It is to be noted that to further reduce the force to be applied in the case of a displacement movement of displaceable element 10, additional torsion joints 38 and/or 39 may be implemented on a spring 14.

FIGS. 4A through 4C show one schematic top view and two schematic cross sections to illustrate a fourth specific embodiment of the micromechanical assembly.

The schematically shown micromechanical assembly is implemented as mirror-symmetric to a central axis 70 parallel to the x axis. The micromechanical assembly has a web component 72, which is along central axis 70. One first displaceable mirror surface 74 is fastened as a displaceable component on web component 72. In addition, at least one actuator electrode comb 18 is fixedly placed on both sides on web component 72. A stator electrode comb 16, which is fixedly placed on mounting 12, is assigned to each of the at least two actuator electrode combs 18. Electrode fingers 20 and 22 of electrode combs 16 and 18 may be parallel to central axis 70.

In the illustrated specific embodiment, three actuator electrode combs 18 are attached on one side of web component 72 in each case. However, it is to be noted that the micromechanical assembly described here is not restricted to a specific number of actuator electrode combs 18 and stator electrode combs 16.

Electrode fingers 20 and 22 of electrode combs 16 and 18 are each divided by at least one insulating layer into at least two conductive areas. Electrode combs 16 and 18 are thus designed for the SEA drive.

Web component 72, first displaceable mirror surface 74, and actuator electrode combs 16 are connected via one first spring 76, which is placed at one first end of web component 72, and one second spring 78, which is placed at one second end of web component 72, to mounting 12. Each of the two springs 76 and 78 is divided by central axis 70 into a subunit having an inner torsion spring 80, a lever 36, and an outer torsion spring 82. Inner torsion spring 80 connects lever 36 to the associated end of web component 72. Outer torsion spring 82 runs from lever 36 to a contact point/anchor point of mounting 12. It is to be noted that the two springs 76 and 78 do not have mirror symmetry with respect to an axis of symmetry between springs 76 and 78. Instead, springs 76 and 78 are implemented in such a way that they allow a displacement movement of first displaceable mirror surface 74 having a lateral component along central axis 70.

Due to the planar design of lever 36 it is possible to attach at least one further displaceable component, such as second displaceable mirror surface 75, to the levers. This allows an increase in the functionality of the micromechanical assembly.

FIGS. 4B and 4C show cross sections through the micromechanical assembly along central axis 70. FIG. 4B shows the position of first displaceable mirror surface 74, web component 72, actuator electrode combs 18, and springs 76 and 78 in relation to mounting 12 in the deenergized mode of the micromechanical assembly. If a nonzero voltage is not applied between electrode combs 16 and 18, web component 72 and actuator electrode combs 18 are in a gap spanned by mounting 12 and stator electrode combs 16. Levers 36 of springs 76 and 78 may be also in the spanned gap in the deenergized mode.

FIG. 4B shows the position of first displaceable mirror surface 74, web component 72, actuator electrode combs 18, and springs 76 and 78 in relation to mounting 12 if a nonzero voltage is applied between electrode combs 16 and 18. If a nonzero voltage is applied between the conductive areas of electrode combs 16 and 18, for example, using the activation unit (not shown), web component 72, first displaceable mirror surface 74, and actuator electrode combs 18 are displaced in one first displacement direction 84 having one first directional component 86 perpendicular to the central plane of stator electrode combs 16, or perpendicular to the xy plane. In addition to first directional component 86, first displacement direction 84 also has one first nonzero lateral component 88 parallel to the central plane of stator electrode combs 16, or parallel to the xy plane and/or along central axis 70.

Due to the displacement movement of components 72, 74, and 18, including first lateral component 88, no elongation stresses act on springs 76 and 78 during the displacement of first displaceable mirror surface 74, but rather only a torsion stress. In other words, springs 76 and 78 in the micromechanical assembly are only twisted, but not elongated, because the mirror-symmetric two-sided clamping during the displacement of first displaceable mirror surface 74 is dispensed with. During a displacement of components 72, 74, and 18 along the first displacement direction, no energy is thus consumed for an elongation of springs 76 and 78. This makes it easier to displace components 72, 74, and 18 and reduces the force to be applied for the displacement.

Due to the advantageous design of electrode combs 16 and 18 for the SEA drive, components 72, 74, and 18 are also displaceable in second displacement direction 90 having one second nonzero directional component 92 perpendicular to the central plane of stator electrode combs 16 and one second nonzero lateral component 94 parallel to the central plane of stator electrode combs 16 (see FIG. 4B). However, this displacement movement of component 72, 74, and 18 is not shown. Second directional component 92 may also be perpendicular to the xy plane, to top side 11 of first displaceable mirror surface 74, and/or to top side 13 of mounting 12. Second lateral component 94 may be parallel to the xy plane and/or along central axis 70. In the micromechanical assembly, lateral components 88 and 94 are oriented in the same direction. Second lateral component 94 may also be oriented in the opposite direction to first lateral component 88, however.

FIGS. 5A through 5C show one schematic top view and two schematic cross sections to illustrate a fifth specific embodiment of the micromechanical assembly.

The micromechanical assembly which is schematically shown in FIG. 5A is a refinement of the specific embodiment of FIGS. 4A through 4C. In the illustrated micromechanical assembly, a central section of web component 72 is implemented as an (inner) frame 100. Actuator electrode combs 18, which cooperate with stator electrode combs 16, which are fastened to mounting 12, are fixedly placed on the outer sides of the frame bars of frame 100, which are parallel to central axis 70.

In addition, frame electrode combs 102 are fastened to the inner sides of the frame bars of inner frame 100, which are parallel to central axis 70. Frame electrode fingers 104 of frame electrode combs 102 may be oriented parallel to electrode fingers 20 and 22 of electrode combs 16 and 18.

Displaceable component 10 is connected to frame 100 via one third spring 106 and one fourth spring 108. Second spring 78 and third spring 106 may be implemented as mirror-symmetric with respect to an axis of symmetry, which may be oriented parallel to the y direction. Correspondingly, first spring 76 and fourth spring 108 may be mirror-symmetric with respect to an axis of symmetry which is oriented parallel to the y direction.

Inner electrode combs 110, which cooperate with frame electrode combs 102, are fixedly placed on displaceable component 10. The orientation of inner electrode fingers 112 of inner electrode combs 110 corresponds to the orientation of frame electrode fingers 104 of frame electrode combs 102. Electrode combs 102 and 110 may be also designed for the SEA drive.

As is noticeable from a comparison of the cross sections of the micromechanical assembly along central axis 70 in the deenergized state (FIG. 5B) and if a between electrode combs 16, 18, 102, and 110 (FIG. 5C), the displaceability of the displaceable component may be increased using the cascading of electrode combs 16, 18, 102, and 110. In addition to the first displacement direction, in which frame 100 is displaceable in relation to mounting 12, displaceable component 10 is displaceable in relation to the frame in one third displacement direction 113. Third displacement direction 113 includes one third nonzero directional component 114 perpendicular to the central plane of stator electrode combs 16 or perpendicular to the xy plane. Third displacement direction 113 also has one third nonzero lateral component 115 parallel to the central plane of stator electrode combs 16, or parallel to the xy plane and/or along central axis 70, in addition to third directional component 114.

In particular, electrode combs 16, 18, 102, and 110 and springs 76, 78, 106, and 108 may be oriented to one another in such a way that first lateral component 88 and third lateral component 115 compensate for one another. Resulting first displacement movement 116 of displaceable component 10 in relation to mounting 12 thus has almost no lateral directional component. Resulting first displacement movement 116 may be perpendicular to the central plane of stator electrode combs 16 or parallel to the z axis. The absolute value of first displacement movement 116 results in this case from the sum of first directional component 86 and third directional component 114. The maximum deflection of displaceable component 10 may thus also be increased using the cascading.

The cascading shown on the basis of FIGS. 5A through 5C is also usable for compensating second lateral component 94. Because of the SEA drive, displaceable component 10 is displaced in relation to frame 100 in one fourth displacement direction 117 having one fourth nonzero directional component 118 perpendicular to the central plane of the stator electrode combs and one fourth nonzero lateral component 119 parallel to the central plane of stator electrode combs 16. Resulting displacement movement 120 of displaceable component 10 in relation to mounting 12 may be opposite to first displacement movement 116 and/or perpendicular to the central plane of stator electrode combs 16.

FIGS. 6A through 6C show three schematic top views of electrode fingers to illustrate a sixth specific embodiment of the micromechanical assembly.

In the schematically shown micromechanical assembly, the at least two stator electrode fingers 20 of the at least one stator electrode comb are each implemented in such a way that a width b, which is parallel to the central plane of the stator electrode comb, of at least one end section of stator electrode finger 20 tapers in a direction from the connection part (not shown) of the stator electrode comb to the end of stator electrode finger 20 facing away from the connection part. The connection part of the stator electrode comb is understood as the component to which the at least two stator electrode fingers 20 are directly or indirectly fastened. The at least two actuator electrode fingers 22 of the at least one actuator electrode comb are also each implemented so that a width b, which is parallel to the central plane of the stator electrode comb, of at least one end section of actuator electrode finger 22 tapers in a direction from the connection part (not shown) of the actuator electrode comb to the end of actuator electrode finger 22 facing away from the connection part. This may also be referred to as a wedge-shaped design of stator electrode fingers 20 and actuator electrode fingers 22.

For example, electrode fingers 20 or 22 have one first width b1, on their end 121 facing away from the connection part, which is less than one second width b2, which is parallel thereto, of electrode finger 20 or 22 at an end 122 facing toward the connection part. First width b1 may be 5 μm, for example. In contrast, second width b2 may be 7 μm. Length l of electrode fingers 20 and 22 may be 200 μm. At least the end sections of electrode fingers 20 and 22 may be formed having smooth side walls 124.

Illustrated electrode fingers 20 and 22 are designed for the SEA drive. It is to be noted that electrode fingers 20 and 22 are located with respect to one another in the deenergized state in such a way that the central longitudinal axes of actuator electrode fingers 22 are in a central plane spanned by the central longitudinal axes of stator electrode fingers 20.

In FIG. 6A, no voltage is applied between the conductive areas (not shown) of electrode fingers 20 and 22. In contrast, in FIG. 6B, one first nonzero voltage U1 is applied between the conductive areas of electrode fingers 20 and 22. Second voltage U2, which is applied in FIG. 6C, is greater than first voltage U1.

As is noticeable upon comparison of FIGS. 6A through 6C, the wedge-shaped design of electrode fingers 20 and 22 and the lateral directional components of the displacement movement of actuator electrode fingers 22 cause a reduction of the effective electrode distance from s0 to s1<s0 and s2<s1 upon application of voltages U1 and U2. Therefore, the attraction force additionally increases between electrode fingers 20 and 22 upon application of a voltage U1 or U2. The change of the electrostatic attraction force may correspond to the deflection due to a suitable wedge angle.

FIGS. 7A through 7C show three schematic top views of electrode combs to illustrate a seventh specific embodiment of the micromechanical assembly.

Electrode fingers 20 and 22 are also wedge-shaped in the seventh specific embodiment. With rising lateral deflection due to applied voltage U1, the effective distance (gap distance) between electrode fingers 20 and 22 decreases and the electrostatic attraction increases.

Due to wedge-shaped electrode fingers 20 and 22, the lateral displacement thus contributes to additionally increasing the electrostatic attraction between electrode fingers 20 and 22. At a specific lateral displacement (FIG. 7B) the effective interacting electrode surface reaches a maximum. At a further lateral displacement (FIG. 7C), the effective interacting electrode surface decreases. As shown via dashed line 126, electrode fingers 20 and 22, which are fastened to connection parts 128, may also be implemented in such a way that the conditions for the electrostatic collapse are not reached.

What is claimed is:

1. A micromechanical assembly, comprising:
   a mounting;
   at least one stator electrode comb, which is fixedly placed on the mounting, having at least two stator electrode fingers, whose central longitudinal axes are on a central plane of the stator electrode comb;
   at least one actuator electrode comb having at least two actuator electrode fingers; and
   a displaceable component, which is coupled to the at least one actuator electrode comb so that the displaceable component is displaceable in relation to the mounting at least in one first displacement direction using a nonzero operating voltage, which is applied between the at least two stator electrode fingers and the at least two actuator electrode fingers, the displaceable component being connected to the mounting by at least one spring;
   wherein the first displacement direction has one first nonzero directional component perpendicular to the central plane.

2. The micromechanical assembly of claim 1, wherein the at least two stator electrode fingers are each divided by at least one stator insulating layer at least into one first conductive stator area and one second conductive stator area, the at least two actuator electrode fingers each being divided by at least one actuator insulating layer at least into one first conductive actuator area and one second conductive actuator area, and the displaceable component being displaceable in relation to the mounting at least in the first displacement direction using one first nonzero voltage, which is applied between the first conductive stator area and the first conductive actuator area as the operating voltage, and being displaceable at least in one second displacement direction using one second nonzero voltage, which is applied between the second conductive stator area and the second conductive actuator area.

3. The micromechanical assembly of claim 2, wherein the second displacement direction is opposite to the first displacement direction and/or has one second nonzero directional component perpendicular to the central plane.

4. The micromechanical assembly of claim 1, wherein the first displacement direction and/or the second displacement direction is perpendicular to the central plane.

5. The micromechanical assembly of claim 1, wherein the displaceable component is connected to the mounting together with the at least one actuator electrode comb via at least one first spring, the first spring including an outer torsion area having one first bending stiffness, an inner torsion area having one second bending stiffness, and a lever, which is placed between the outer torsion area and the inner torsion area, having one third bending stiffness, and the third bending stiffness of the lever being greater than the first bending stiffness of the outer torsion area and/or the second bending stiffness of the inner torsion area.

6. The micromechanical assembly of claim 5, wherein at least one torsion joint is implemented in at least one of the outer torsion area and the inner torsion area.

7. The micromechanical assembly of claim 6, wherein the at least one torsion joint has at least one through opening.

8. The micromechanical assembly of claim 1, wherein the displaceable component is connected to the mounting together with the at least one actuator electrode comb via at least the first spring and one second spring, and the first spring being designed as mirror-symmetric to the second spring with respect to an axis of symmetry running centrally through the displaceable component.

9. The micromechanical assembly of claim 1, wherein the displaceable component is connected via one third spring and one fourth spring to a frame, which is connected via the first spring and the second spring to the mounting, and at least one frame electrode comb being fixedly placed on the frame and the displaceable component being coupled to at least one inner electrode comb so that the displaceable component is displaceable at least in one third displacement direction in relation to the mounting using one third voltage, which is applied between the at least one frame electrode comb and the at least one inner electrode comb.

10. The micromechanical assembly of claim 9, wherein the fourth spring is configured as mirror-symmetric with respect to the first spring and the second spring is configured as mirror-symmetric with respect to the third spring.

11. The micromechanical assembly of claim 1, wherein the at least two stator electrode fingers of the at least one stator electrode comb are each implemented in such a way that a width, which is parallel to the central plane of the stator electrode comb, of at least one end section of the stator electrode finger tapers in a direction from the connection part of the stator electrode comb to an end of the stator electrode finger facing away from the connection part.

12. The micromechanical assembly of claim 1, wherein the displaceable component includes at least one optical element.

13. The micromechanical assembly of claim 12, wherein the displaceable component includes at least one of a mirror surface, a lens, and a beam splitter as the optical element.

* * * * *